(12) United States Patent
Cheng et al.

(10) Patent No.: US 8,008,160 B2
(45) Date of Patent: Aug. 30, 2011

(54) METHOD AND STRUCTURE FOR FORMING TRENCH DRAM WITH ASYMMETRIC STRAP

(75) Inventors: Kangguo Cheng, Guilderland, NY (US); Xi Li, Somers, NY (US); Richard Wise, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 391 days.

(21) Appl. No.: 12/017,154

(22) Filed: Jan. 21, 2008

(65) Prior Publication Data
US 2009/0184392 A1 Jul. 23, 2009

(51) Int. Cl.
H01L 21/20 (2006.01)
(52) U.S. Cl. .................. 438/389; 257/E21.651
(58) Field of Classification Search .......... 438/389; 257/E21.651
See application file for complete search history.

(56) References Cited

U.S. PATENT DOCUMENTS

| | | | |
|---|---|---|---|
| 5,264,716 A | 11/1993 | Kenney | |
| 5,482,883 A | 1/1996 | Rajeevakumar | |
| 5,930,585 A | 7/1999 | Coronel et al. | |
| 6,008,104 A | 12/1999 | Schrems | |
| 6,271,142 B1 | 8/2001 | Gruening et al. | |
| 6,355,529 B2 * | 3/2002 | Heo et al. ........... | 438/270 |
| 6,426,526 B1 | 7/2002 | Divakaruni et al. | |
| 6,498,061 B2 | 12/2002 | Divakaruni et al. | |
| 6,566,177 B1 | 5/2003 | Radens et al. | |
| 6,566,190 B2 * | 5/2003 | Lee et al. ........... | 438/242 |
| 6,573,137 B1 | 6/2003 | Divakaruni et al. | |
| 6,833,305 B2 | 12/2004 | Mandelman et al. | |
| 6,919,255 B2 | 7/2005 | Birner et al. | |
| 7,019,350 B2 | 3/2006 | Hsu | |
| 7,074,689 B2 | 7/2006 | Gutsche et al. | |
| 2005/0164446 A1 | 7/2005 | Lin et al. | |
| 2005/0186730 A1 * | 8/2005 | Hsu .................... | 438/243 |
| 2005/0277247 A1 * | 12/2005 | Wu et al. ............ | 438/243 |
| 2006/0084223 A1 | 4/2006 | Seidl | |
| 2006/0134877 A1 | 6/2006 | Goebel et al. | |
| 2007/0102744 A1 * | 5/2007 | Okajima ............. | 257/301 |

FOREIGN PATENT DOCUMENTS

| | | |
|---|---|---|
| DE | 10219123 A1 | 11/2003 |
| WO | 03/067596 A | 8/2003 |

OTHER PUBLICATIONS

International Search Report dated May 15, 2009.

* cited by examiner

*Primary Examiner* — W. David Coleman
(74) *Attorney, Agent, or Firm* — Joseph Petrokaitis

(57) ABSTRACT

A method of forming a trench device structure having a single-side buried strap is provided. The method includes forming a deep trench in a semiconductor substrate, said deep trench having a first side portion and a second side portion; depositing a node dielectric on said deep trench, wherein said node dielectric covers said first side portion and said second side portion; depositing a first conductive layer over said node dielectric; performing an ion implantation or ion bombardment at an angle into a portion of said node dielectric, thereby removing said portion of said node dielectric from said first side portion of said deep trench; and depositing a second conductive layer over said first conductive layer, wherein said second conductive layer outdiffuses into a portion of said semiconductor substrate. A trench device structure having a single-side buried strap is also provided. The device structure includes a semiconductor substrate having a deep trench therein; and a first conductive layer and a second conductive layer sequentially disposed on said deep trench, wherein said second conductive layer outdiffuses into a portion of said semiconductor substrate.

17 Claims, 7 Drawing Sheets

METHOD AND STRUCTURE FOR FORMING TRENCH DRAM WITH ASYMMETRIC STRAP

BACKGROUND OF THE INVENTION

1. Technical Field

The present disclosure relates generally to semiconductor memory devices, and, more particularly, to an improved method and structure for forming a deep trench capacitor structure having asymmetric buried strap.

2. Description of Related Art

A dynamic random access memory (DRAM) comprises a capacitor for storing charge and a pass transistor (also called a pass gate, access transistor, or switching transistor) for transferring charge to and from the capacitor. Data (i.e. 1 bit) stored in the cell is determined by the absence or presence of charge on the storage capacitor. In a crosspoint DRAM memory array, bitlines and wordlines crisscross the array and a storage capacitor is accessible at every place where a bitline crosses a wordline. FIG. 1 illustrates an example of such an array in which, the wordlines cross a semiconductor surface along one axis and the bitlines cross the semiconductor surface along a perpendicular axis. A storage capacitor is formed in the bottom of each deep trench, as illustrated in the figure. An access transistor is then formed vertically along one sidewall of the deep trench above the storage capacitor, such that the gate conductor lies along that sidewall. The elements of this vertical MOSFET transistor include a drain region within the single crystal silicon at the edge of the trench, this is coincident with the "buried strap outdiffusion", a gate conductor along one sidewall of the trench, and a source of the transistor in the surface plane under the contact to bitline (CB) areas.

In such crosspoint designs, each storage capacitor must typically be accessible from only one side of the deep trench, otherwise the one wordline, one bitline, one memory bit rule would be violated. Therefore, an interconnection is formed between the storage capacitor and the vertical sidewall only along one sidewall of the deep trench, while the deep trench is isolated along all other sidewalls. In the structure illustrated in FIG. 1, two of the deep trench sidewalls are isolated by shallow trench isolation (STI) regions. Of the two deep trench sidewalls that coincide with the active areas, a buried strap is formed along one of them, and the other sidewall is isolated.

Since the active area of the memory is defined by stripes along the-semiconductor surface, (in FIG. 1 the stripes are coincident with the bitline (BL) pattern), there needs to be methods for forming the buried strap interconnection and transistor along the one deep trench sidewall, while isolating the other sidewall coincident with the active area pattern.

Prior art methods of forming asymmetric buried strap in a trench DRAM are complicated and costly because they require either a strap mask or deposition, and etch of multiple sacrificial layers. For example, various methods include forming an asymmetric strap by adding multiple extra process steps including deposition of multiple layers including a sacrificial undoped poly layer, implanting boron into the poly layer on one side of the trench, removing the undoped poly selective to the born-doped poly, using the remaining poly as a mask to form the asymmetric strap, and finally removing the doped poly layer. However, this method is complex and it essentially increases process cost.

Accordingly, a need exists for forming trench eDRAM having asymmetric strap using alternative methods circumventing the limitations of the prior art. The present disclosure provides an improved method and structure for forming trench DRAM or embedded DRAM with asymmetric strap.

SUMMARY OF THE INVENTION

The present disclosure is directed to a structure and method of forming a transistor trench memory cell structure having an asymmetric trap. In one embodiment, a method of forming a trench device structure having a single-side buried strap is described. The method includes forming a deep trench in a semiconductor substrate, the deep trench having a first side portion and a second side portion; depositing a node dielectric on the deep trench, where the node dielectric covers the first side portion and the second side portion; depositing a first conductive layer over the node dielectric; performing an ion implantation or ion bombardment at an angle and thereby removing the portion of the node dielectric from the first side portion of the deep trench; and depositing a second conductive layer over the first conductive layer, where dopants in the second conductive layer outdiffuses into a portion of the semiconductor substrate. In one embodiment, the semiconductor substrate is a bulk silicon substrate. Alternatively, the semiconductor substrate is a silicon-on-insulator substrate. The node dielectric is selected from a group consisting of oxide, nitride, oxynitride, high-k dielectric, materials. In one embodiment, the first and second conductive layers are composed of doped polysilicon. Moreover, the ions in the angled ion implantation or the angled ion bombardment comprise argon, xenon, krypton, germanium, silicon, arsenic, phosphorus, antimony, boron, and/or indium ions. In one particular embodiment, the method of forming a trench device structure further includes forming a transistor adjacent the single-sided strap, where at least a portion of the node dielectric prevents dopant diffusion on the second side portion of the trench. In addition, in one embodiment, the method further includes a collar insulating layer formed in an upper portion of the deep trench for isolating a portion of the first conductive layer from the semiconductor substrate, where the angled ion implantation or ion bombardment removes a portion of the collar insulating layer from the first side portion of the deep trench. In this particular embodiment, dopants in the second conductive layer outdiffuse into a portion of the semiconductor substrate. The collar insulating layer includes a thickness ranging from about 100 to about 300 A. Moreover, the collar, insulating layer comprises thermal oxide, tetra ethyl ortho silicate (TEOS), and/or silicon nitride.

In another embodiment, a method of forming a trench device structure having a single-side buried strap is described. The method includes forming a deep trench having a first side portion and a second side portion in a semiconductor substrate; forming a node dielectric on the deep trench; forming a collar insulating layer lining on an upper portion of first and second side portions; depositing a first conductive layer over the deep trench; performing an ion implantation or ion bombardment at an angle and thereby removing a portion of the collar insulating layer from at least one of the first and second side portions thereby exposing a portion of the semiconductor substrate; and depositing a second conductive layer over the first conductive layer, wherein dopants in the second conductive layer outdiffuses into the portion of the semiconductor substrate. The semiconductor substrate may be either a bulk Si substrate or, alternatively, an SOI substrate. The node dielectric is selected from a group consisting of oxide, nitride, oxynitride, high-k dielectric materials. In addition, the first and second conductive layers are composed of doped polysilicon. Moreover, the ions in the angled ion implantation or the angled ion bombardment comprise argon, xenon, krypton, germanium, silicon, arsenic, phosphorus, antimony, boron, and/or indium ions. The method of forming a trench device structure further includes forming a transistor adjacent the single-sided strap, where at least a portion of the collar insulating layer prevents dopant diffusion on the second side portion of the deep trench. The collar, insulating layer comprises thermal oxide, tetra ethyl ortho silicate (TEOS), and/or silicon nitride.

A trench device structure having a single-side buried strap is also described. The structure includes a semiconductor substrate having a deep trench therein; and a first conductive layer and a second conductive layer sequentially disposed on the deep trench, where dopants in the second conductive layer outdiffuses into a portion of the semiconductor substrate. The semiconductor substrate is a bulk Si substrate or, alternatively, an SOI substrate. The first and second conductive layers are composed of doped polysilicon. The trench device structure further includes a collar insulating layer lining on an upper portion of the deep trench for isolating a portion of the first conductive layer and the second conductive layer from the semiconductor substrate, where a portion of the collar insulating layer is removed for permitting dopants in the first conductive layer to outdiffuse into the semiconductor substrate for forming the single-side buried strap. The collar insulating layer is composed of thermal oxide, tetra ethyl ortho silicate (TEOS), and/or silicon nitride. In addition, the collar insulating layer includes a thickness ranging from about 100 to 300 A (Angstroms). In one particular embodiment, the trench device structure further includes a transistor adjacent the single-sided strap, wherein at least a portion of the collar insulating layer prevents dopant diffusion on the second side portion of the trench. In yet another embodiment, the trench device structure further includes a node dielectric layer lining the deep trench for isolating a portion of the first conductive layer and the second conductive layer from the semiconductor substrate, where a portion of the node dielectric layer is removed for permitting the first conductive layer to outdiffuse into the semiconductor substrate for forming the single-side buried strap. The node dielectric layer is selected from a group consisting of oxide, nitride, oxynitride, and high-k dielectric materials. The node dielectric layer includes a thickness ranging from about 30 to 100 A.

A design structure embodied in a machine readable medium for designing, manufacturing and/or testing a design is also described. The design structure includes a semiconductor substrate having a deep trench, where the deep trench includes a single-sided strap therein; and a first conductive layer and a second conductive layer sequentially disposed on the deep trench, where the second conductive layer outdiffuses into a portion of the semiconductor substrate. Furthermore, a method of forming a design structure embodied in a computer readable medium for performing a means for fabricating a deep trench having a single-sided strap is described. The method includes means for forming a deep trench in a semiconductor substrate, the deep trench having a first side portion and a second side portion; means for depositing a node dielectric on the deep trench, where the node dielectric covers the first side portion and the second side portion; means for depositing a first conductive layer over the node dielectric; means for performing at least one of an ion implantation and an ion bombardment at an angle into a portion of the node dielectric, thereby removing the portion of the node dielectric from the first side portion of the deep trench; and means for depositing a second conductive layer over the first conductive layer, where the second conductive layer outdiffuses into a portion of the semiconductor substrate.

Other features of the presently disclosed structure and method of forming a trench memory with an asymmetric strap will become apparent from the following detailed description taken in conjunction with the accompanying drawing, which illustrate, by way of example, the presently disclosed structure and method.

BRIEF DESCRIPTION OF THE DRAWINGS

The features of the presently disclosed structure and method of forming a trench DRAM with asymmetric strap will be described hereinbelow with references to the figures, wherein.

DETAILED DESCRIPTION

Figure 1:
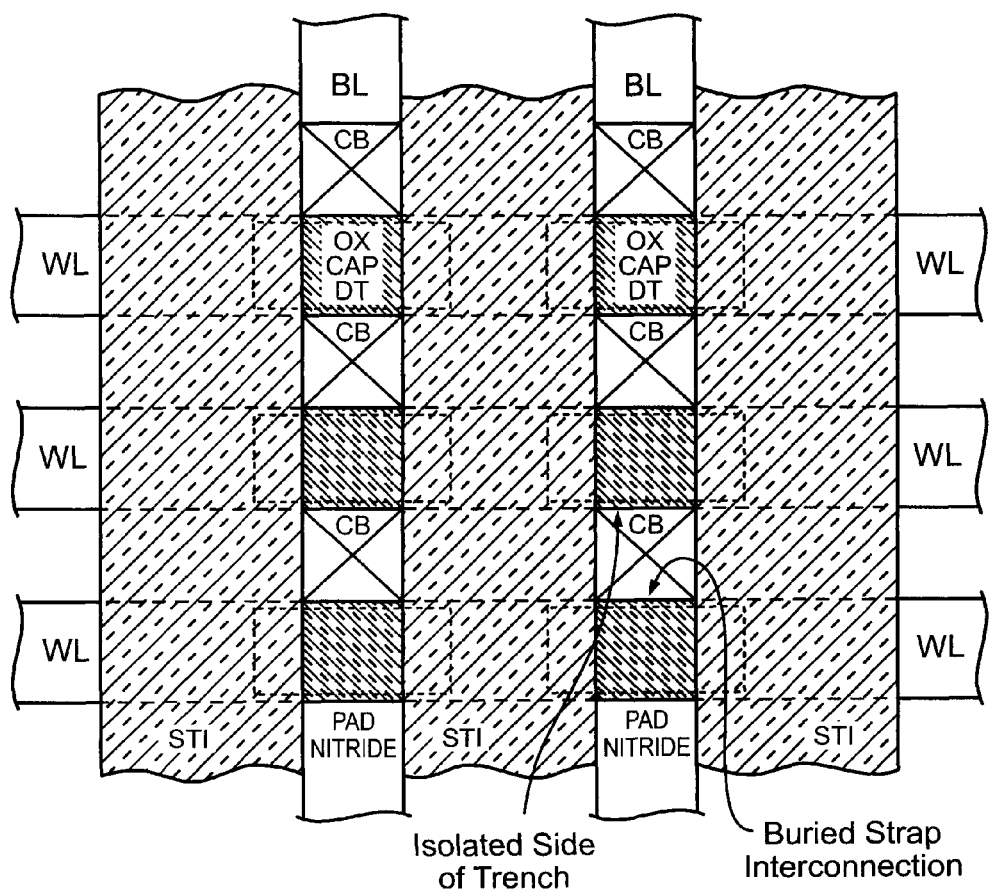
FIG. 1 illustrates a simplified overhead view of a conventional crosspoint DRAM memory array.

Referring now to the drawing figures, wherein like references numerals identify identical or corresponding elements, an embodiment of the presently disclosed improved method and structure for forming trench embedded DRAM with asymmetric strap will be disclosed in detail. In the following description, numerous specific details are set forth, such as particular structures, components, materials, dimensions, processing steps and techniques, in order to provide a thorough understanding of the present invention. However, it will be appreciated by one skilled in the art that the invention may be practiced without these specific details. In other instances, well-known structures or processing steps have not been described in detail to avoid obscuring the invention.

FIGS. 2-5 illustrate exemplary process steps of forming an asymmetric (i.e. single-sided) strap in a trench embedded DRAM at various stages in accordance with one embodiment of the present disclosure. In particular, the single-sided buried strap is formed in a transistor trench memory cell. More in particular, a pad layer is first formed over the device structure prior to patterning. Using standard processes, one or more deep trench areas are then formed in the structure. A node dielectric is then formed over the deep trench area. A first doped polysilicon is then deposited in the deep trench. An angled ion bombardment is then performed to remove a portion of the node dielectric from one side of the trench. Finally, a second doped polysilicon is deposited, and dopants in the second polysilicon outdiffuse into the structure to form a single-sided strap. Memory cells are then formed using standard processes well known in the art. For example, methods of forming transistor trench memory are set forth in greater detail in commonly assigned U.S. Pat. No. 6,566,177 entitled "Silicon-on-insulator vertical array device trench capacitor DRAM" to Radens et al. and U.S. Pat. No. 6,833,305 entitled "Vertical DRAM punchthrough stop self-aligned to storage trench" to Mandelman et al., the disclosures of which are incorporated by reference herein in its entirety.

The above structure and method of the present disclosure enables the simplified and low-cost process of forming a single-sided buried strap without the need for deposition and removal of sacrificial layers.

Figure 2:
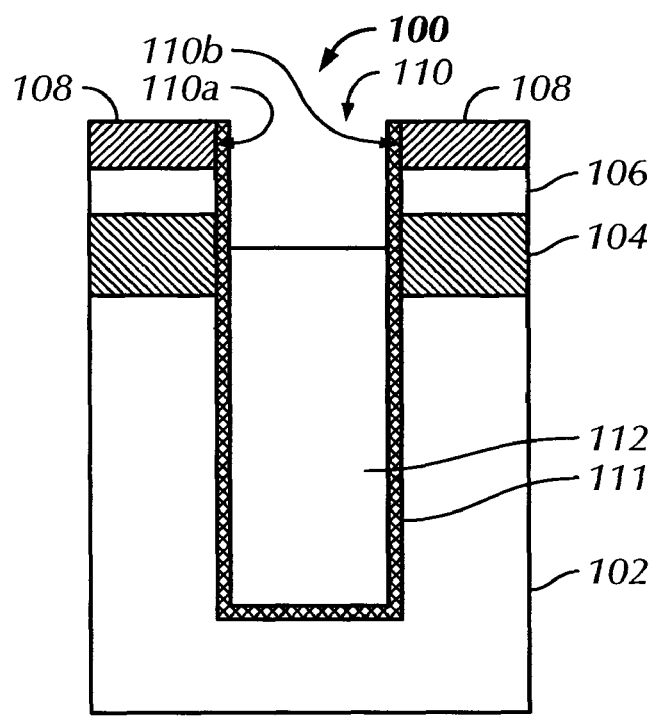
FIGS. 2-5 illustrate simplified cross-sectional views of a method of forming a transistor trench memory cell structure at various stages in accordance with one embodiment of the present disclosure.

With initial reference to FIG. 2, a standard process to form a trench capacitor on a silicon-on-insulator (SOI) substrate, in accordance with the present disclosure, is illustrated and is designated generally as structure 100. Structure 100 includes a base semiconductor substrate 102; a buried oxide (BOX) layer 104 formed on base semiconductor substrate 102; and a SOI layer 106 formed on BOX layer 104, where BOX layer 104 isolates SOI layer 106 from base semiconductor substrate 102. A pad layer 108 is then formed on a top surface of SOI layer 106.

Base semiconductor substrate 102 may include any of several semiconductor materials well known in the art, such as, for example, a bulk silicon substrate, silicon-on-insulator (SOI) and silicon-on-sapphire (SOS). Other non-limiting examples include silicon, germanium, silicon-germanium alloy, silicon carbide, silicon-germanium carbide alloy and compound (i.e. III-V and II-VI) semiconductor materials. Non-limiting examples of compound semiconductor materials include gallium arsenide, indium arsenide and indium phosphide semiconductor material. Typically, base semiconductor substrate 102 may be about, but is not limited to, several hundred microns thick. For example, base semiconductor substrate 102 may include a thickness ranging from about 0.5 mm to about 1.5 mm.

BOX layer 104 may be formed from any of several dielectric materials. Non-limiting examples include, for example, oxides, nitrides and oxynitrides of silicon. Oxides, nitrides and oxynitrides of other elements are also envisioned. In addition, BOX layer 104 may include crystalline or non-crystalline dielectric material. Moreover, BOX layer 104 may be formed using any of several methods. Non-limiting examples include ion implantation methods, thermal or plasma oxidation or nitridation methods, chemical vapor deposition methods and physical vapor deposition methods. Typically, BOX layer 104 includes an oxide of the semiconductor from which base semiconductor substrate 102 is comprised. In one embodiment, BOX layer 104 includes a thickness of about 150 nm. Alternatively, BOX layer 104 may include a thickness ranging from about 10 nm to about 500 nm.

SOI layer 106 may include any of the several semiconductor materials included in base semiconductor substrate 102. In general, base semiconductor substrate 102 and SOI layer 106 may include either identical or different semiconductor materials with respect to chemical composition, dopant concentration and crystallographic orientation. In one particular embodiment of the present disclosure, base semiconductor substrate 102 and SOI layer 106 include semiconductor materials that include at least different crystallographic orientations. Typically one of base semiconductor substrate 102 and SOI layer 106 includes a {110} crystallographic orientation and the other of base semiconductor substrate 102 and SOI layer 106 includes a {100} crystallographic orientation. Typically, SOI layer 106 includes a thickness ranging from about 5 nm to about 100 nm. Methods for making SOI substrate are well known in the art. Non-limiting examples include SIMOX (Separation by Implantation of OXygen), wafer bonding, and ELTRAN® (Epitaxial Layer TRANsfer).

Pad layer 108 includes an insulating material such as, for example, silicon nitride. Pad layer 108 may be formed using conventional deposition methods, for example, low-pressure chemical vapor deposition (LPCVD) and depositing SiN of a thickness ranging from about 10 nm to about 500 nm. In one particular embodiment, pad nitride layer 108 includes a thickness of about 100 nm. Optionally, a thin (2 nm to 10 nm, preferably 5 nm) thermal oxide layer (not shown) may be formed on SOI layer 106 prior to forming pad nitride layer 108.

With continued reference to FIG. 2, a cell location is identified and a mask layer (not shown) of a suitable masking material is deposited on pad layer 108 and patterned using a conventional photolithography technique. The mask layer includes suitable masking materials such as, for example, photoresist or hardmask such as silicon dioxide. Deep trench 110, having first side portion 110a and second side portion 110b, is defined and formed by etching through pad layer 108, SOI layer 106, BOX layer 104 and base semiconductor layer 102, as illustrated by the figure. Trench 110 is formed using, for example, an anisotropic dry etch technique, such as reactive ion etch (RIE). The mask layer may be removed after trench 110 is formed or, alternatively, in a later process. A so-called and not-shown "buried plate", which is a doped region in the substrate 102 surrounding a lower portion of the deep trench 110, is formed by any known methods in the art. A node dielectric 111 (e.g. oxide, nitride, oxynitride and/or high-k materials) is formed about trench 110 by any suitable process such as thermal oxidation thermal nitridation, atomic layer deposition, chemical vapor deposition, etc. Node dielectric layer 111 may include a thickness ranging from about 30 to 100 A, although the thickness of the node dielectric layer 111 less than 30 A or greater than 100 A are explicitly conceived. A first conductive layer 112 is then deposited on the surface of node dielectric 111 and fill the trench 110. First conductive layer 112 is then recessed to a predetermined depth (e.g., slightly below the interface between SOI and BOX layers). Any conventional etch process, for example, plasma etch, reactive ion etch, or chemical downstream etch, can be used to recess the first conductive layer 112.

First conductive layer 112 may comprise any suitable conductive material, including but not limited to, doped polycrystalline or amorphous silicon, germanium, silicon germanium, a metal (e.g., tungsten, titanium, tantalum, ruthenium, zirconium), a conducting metallic compound material (e.g., tantalum nitride, titanium nitride, tungsten silicide, tungsten nitride, titanium nitride, tantalum nitride), carbon nanotube, conductive carbon, or any suitable combination of these materials. First conductive layer 112 can be deposited by any suitable methods, including but not limited to, atomic layer deposition (ALD), chemical vapor deposition (CVD), low-pressure chemical vapor deposition (LPCVD), ultrahigh vacuum chemical vapor deposition (UHVCVD), metalorganic chemical vapor deposition (MOCVD), physical vapor deposition, sputtering, plating, evaporation, spin-on-coating, ion beam deposition, electron beam deposition, laser assisted deposition, and chemical solution deposition. In one particular embodiment, first conductive layer 112 comprises doped polysilicon deposited by LPCVD and recessed by RIE.

Figure 3:
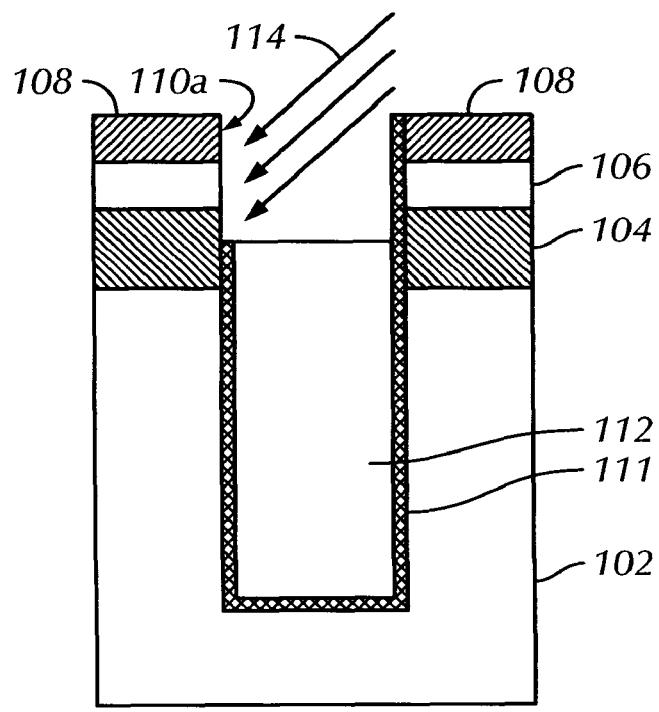

With reference to FIG. 3, in conjunction with FIG. 2, an angled ion bombardment or ion implantation 114 is performed on the first side portion 110a of deep trench 110 for removing a portion of node dielectric layer 111 from the first side portion 110a of deep trench 110. In one embodiment, the process 114 is an angled ion bombardment by which the portion of node dielectric layer 111 is removed by physical sputtering of high energy ions. In another embodiment, the process 114 is an angled ion implantation by which ions are incorporated into the portion of the node dielectric 111 and thus alter the film properties on the first side portion 110a of deep trench 110. For example, defects can be introduced into the implanted film, rendering implanted film more susceptible to removal by etching than the film without implantation. It is noted that depending on the material properties and thickness of node dielectric 111, the dimensions of deep trench 110, and the recess depth of first conductive material 112, the species and conditions of the angled ion bombardment can be optimized to remove a portion of the node dielectric 111 on the first side portion 110a of deep trench 110 without undesirable damages on the sidewalls of the SOI and BOX layers.

The ions in the angled ion bombardment include ions including but not limited to, argon, xenon, krypton, germanium, silicon, arsenic, phosphorus, antimony, boron, and/or indium ions. The ion energy ranges preferably from 5 KeV to 200 KeV, more preferably from 10 KeV to 100 KeV, and most preferably from 30 KeV to 50 KeV. The tilt angle of ion beam relative to the sidewall of the deep trench 110 ranges preferably from 3 degree to 60 degree, more preferably from 5 degree to 45 degree, and most preferably from 15 degree to 30 degree. The dose of the ions ranges preferably from 1E13/cm2 to 1E16/cm2, more preferably from 5E13/cm2 to 1E15/cm2, and most preferably 1E14/cm2 to 3E14/cm2.

In one particular embodiment, node dielectric layer 111 is an oxynitride film with a thickness about 50 A. An angled ion implantation of xenon with a tilt angle of 30 degree, energy of 20 KeV, and a dose of 1E14/cm2 is performed on node dielectric 111 and on the first side portion 110a of deep trench 110. A wet etch process with an etchant containing hydrofluoric/ethylne glycol (HF/EG) is performed to remove the implanted node dielectric layer 111 on the first side portion 110a with minimal loss of the node dielectric 111 on the second portion 110b of the deep trench 110.

Figure 4:
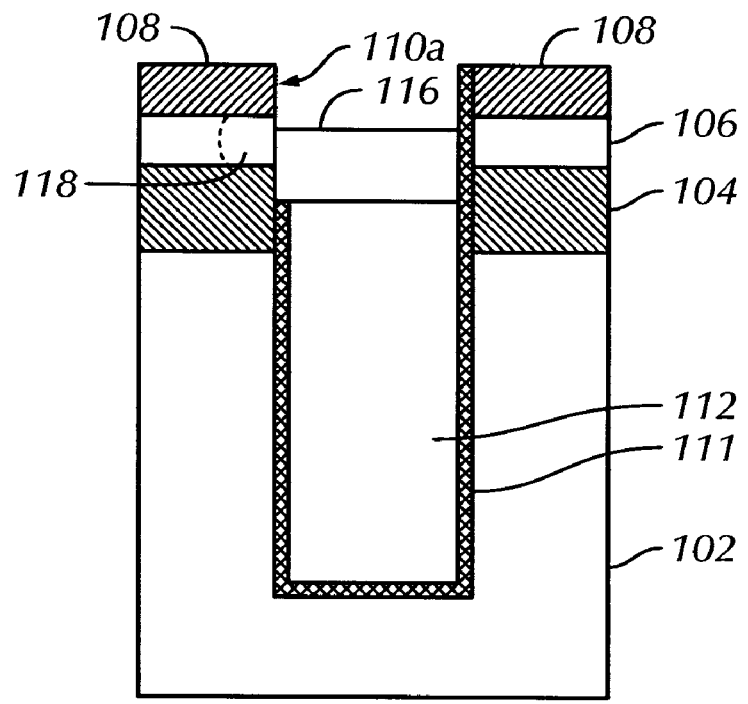

With reference to FIG. 4, in conjunction with FIGS. 2 and 3, a second conductive layer 116 is deposited and then recessed at the same level or slightly below the top surface of the SOI layer 106. Second conductive layer 116 may include the same or different material from the first conductive layer 112, as described in detail hereinabove. In addition, similar processes described above for first conductive layer 112 can be used for deposition and recess of the second conductive layer 116. In one particular embodiment, second conductive layer 116 comprises doped polysilicon deposited by LPCVD and recessed by RIE. The polysilicon can be doped by arsenic, phosphorus, antimony, boron, and/or indium. Dopants in polysilicon 116 outdiffuses into SOI layer 106 to form single-sided buried strap nitride 118 during a subsequent thermal anneal process.

Figure 5:
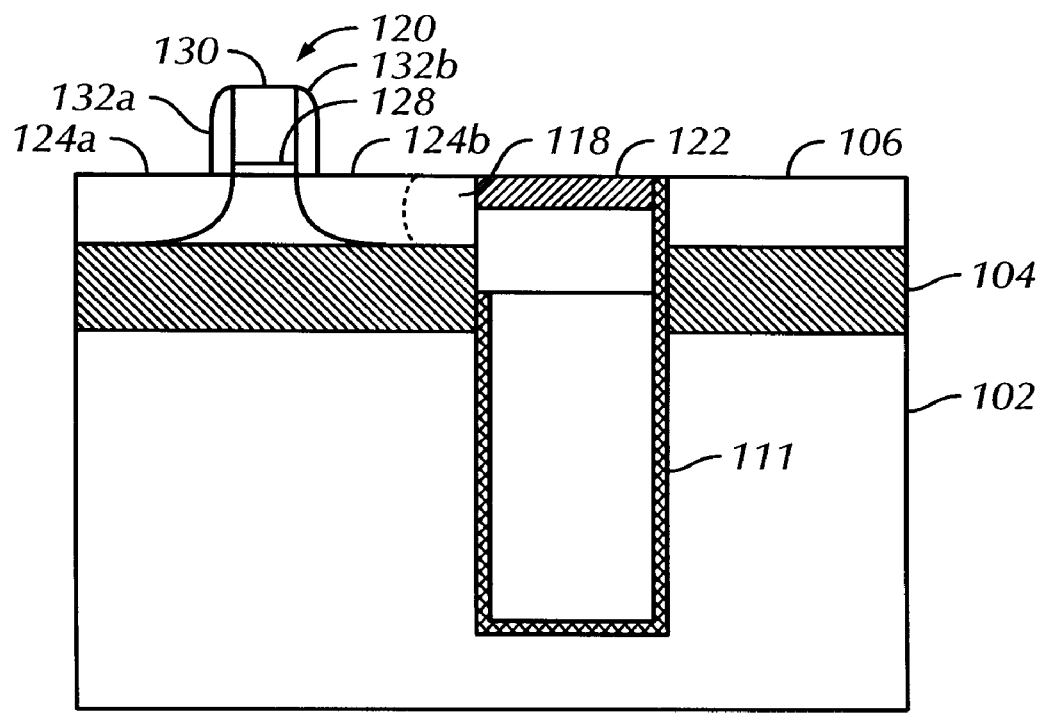

With reference to FIG. 5, in conjunction with FIGS. 2-4, the formation of a DRAM memory device is completed by forming isolation layer 122 (e.g., oxide formed in shallow trench isolation (STI) process); removing the pad layer 122, and forming a transistor 120 by using processes well known in the art. Transistor 120 includes two source/drain terminals 124a and 124b separated by a channel region 126 in the SOI layer 106, a gate dielectric layer 128 above the channel region 126, and a gate conductor 130 atop the gate dielectric 128.

One source/drain terminal 124b is electrically connected to the strap 118. The transistor 120 may further include spacers 132a and 132b on the sidewalls of the gate conductor 130 and gate dielectric 128.

FIGS. 6-10, illustrate a structure and method of forming a transistor trench memory cell structure at various stages in accordance with a second embodiment of the present disclosure. In this particular embodiment, a trench DRAM is formed on a bulk structure 200. Bulk structure 200 is similar to structure 100 and will only be discussed in detail to the extent necessary to identify differences in the structure and/or process.

Figure 6:
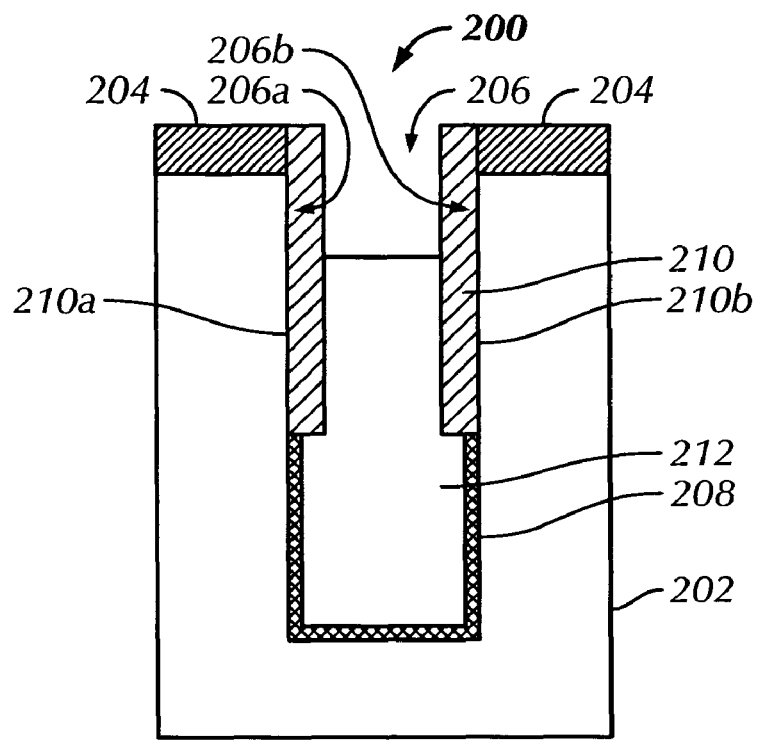
FIGS. 6-10 illustrate simplified cross-sectional views of a method of forming a transistor trench memory cell structure at various stages in accordance with a second embodiment of the present disclosure.

With initial reference to FIG. 6, a standard process of forming a trench capacitor on a bulk substrate, in accordance with the present disclosure, is illustrated and is designated generally as Bulk structure 200. Bulk structure 200 includes a base semiconductor substrate 202 and a pad layer 204 formed on a top surface of base substrate 202. The base substrate can be any semiconductor materials, including but not limited to, silicon, germanium, silicon germanium, and/or compound (i.e. Ill-V and II-VI) semiconductor materials. For simplicity, the base semiconductor substrate is referred as a bulk Si substrate hereinafter. A cell location is identified and a mask layer (not shown) of a suitable masking material is deposited on pad layer 204 and patterned using a conventional photolithography technique. Deep trench 206, having first side portion 206a and second side portion 206b, is defined and formed by etching through pad layer 204 and bulk Si substrate 202. Deep trench 206 is formed using, for example, an anisotropic dry etch technique, such as RIE. A so-called and not-shown "buried plate", which is a doped region in the substrate 202 surrounding a lower portion of the deep trench 206, is formed by any known methods in the art. A node dielectric 208 is formed about trench 110 by any suitable process, as discussed in details hereinabove. The buried plate and later formed conductive material in the trench serve as two electrodes of the trench capacitor and the node dielectric 208 serves as the dielectric of the capacitor. A collar insulating layer having collar insulating layer 210a, 210b is formed on first and second side portions 206a, 206b of deep trench 206. The collar helps reduce the parasitic leakage current in a trench DRAM. Collar insulating layer comprises, for example, thermal oxide, tetra ethyl ortho silicate (TEOS), silicon nitride, and/or any other suitable dielectric such as high-k materials. The collar is formed by deposition of the collar insulating layer followed by an anisotropic etch (e.g., RIE) process. The formation of the collar can be performed at various stages of formation of the trench capacitor known in the art (see U.S. Pat. No. 6,008,104, 5,930,585, 6,271,142, 6,919,255, 5,264,716, and 5,482,883, for reference).

Still with reference to FIG. 6, a first conductive layer 212 is then deposited on the surface of node dielectric 208 and a portion of collar insulating layers 210a, 210b, to fill deep trench 206. First conductive layer 212 is then recessed to a predetermined depth (e.g. below the interface between bulk Si substrate 202 and pad layer 204) using suitable processes, as discussed in details hereinabove with respect to first conductive layer 112.

Figure 7:
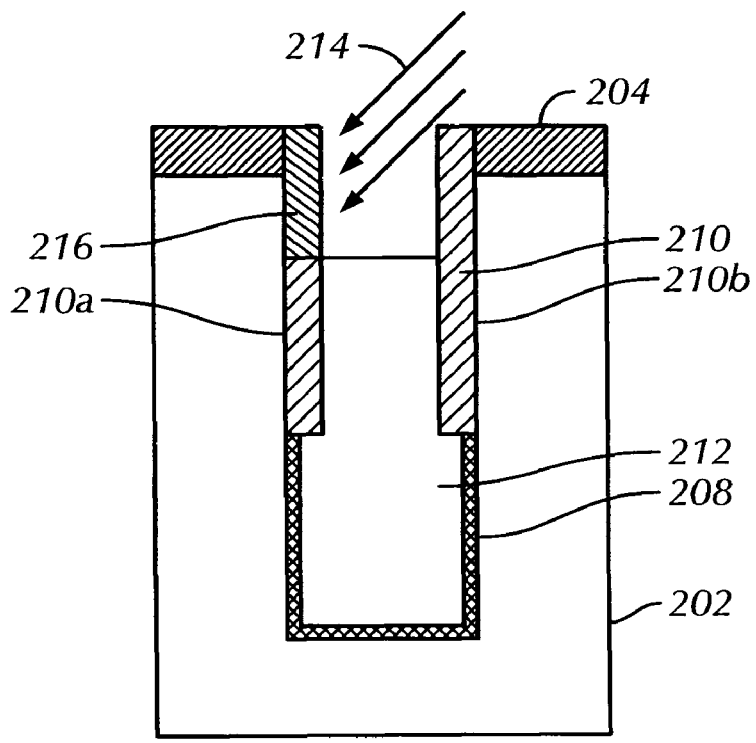

With reference to FIG. 7, in conduction with FIG. 6, an angled ion bombardment or ion implantation 214 is performed on collar insulating layer 210a for damaging collar insulating layer 210a and forming damaged collar 216. In one embodiment, the process 214 is an angled ion bombardment by which the portion of collar 210 is removed by physical sputtering of high energy ions, resulting in the structure illustrated by FIG. 8. In another embodiment, the process 214 is an angled ion implantation by which ions are incorporated into a portion of the collar node dielectric 210, resulting in damaged collar portion 216. Damaged collar 216 is then removed, resulting in the structure illustrated by FIG. 8.

Figure 8:
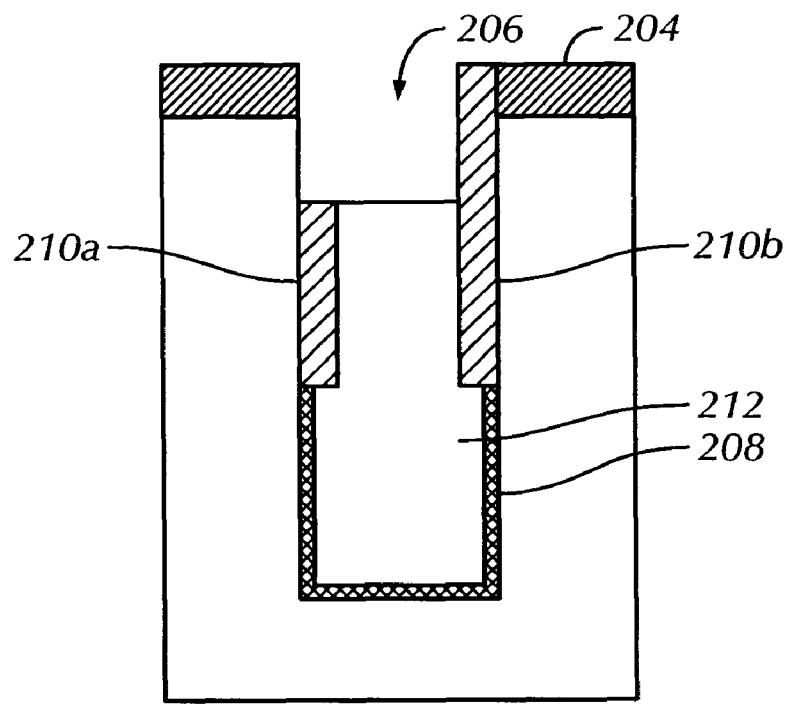
Figure 9:
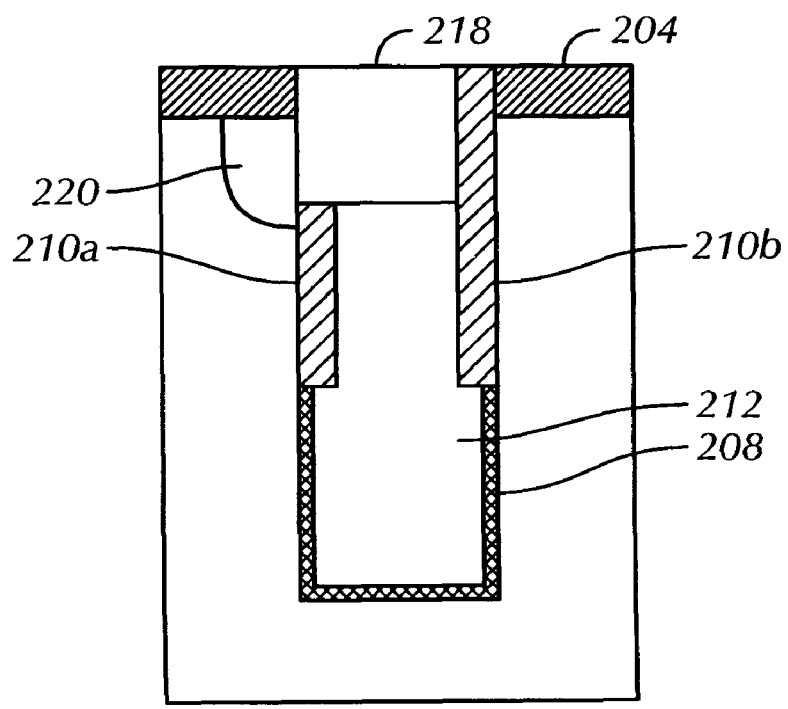

With reference to FIG. 9, in conjunction with FIGS. 6-8, a second conductive layer 218 is deposited and planarized to the same level a top surface of pad layer 204. Second conductive layer 218 is selected from the same group of materials described hereinabove with respect to first conductive layer 112. Dopants in second conductive layer 218 outdiffuses into bulk Si substrate 202 during subsequent thermal anneal process, forming single-sided buried strap 220 It is noted that, collar 210a and 210b helps reduce the parasitic leakage current in trench memory device. Furthermore, the collar insulating layer 210b prevents dopant diffusion on the other side of trench 206.

Figure 10:
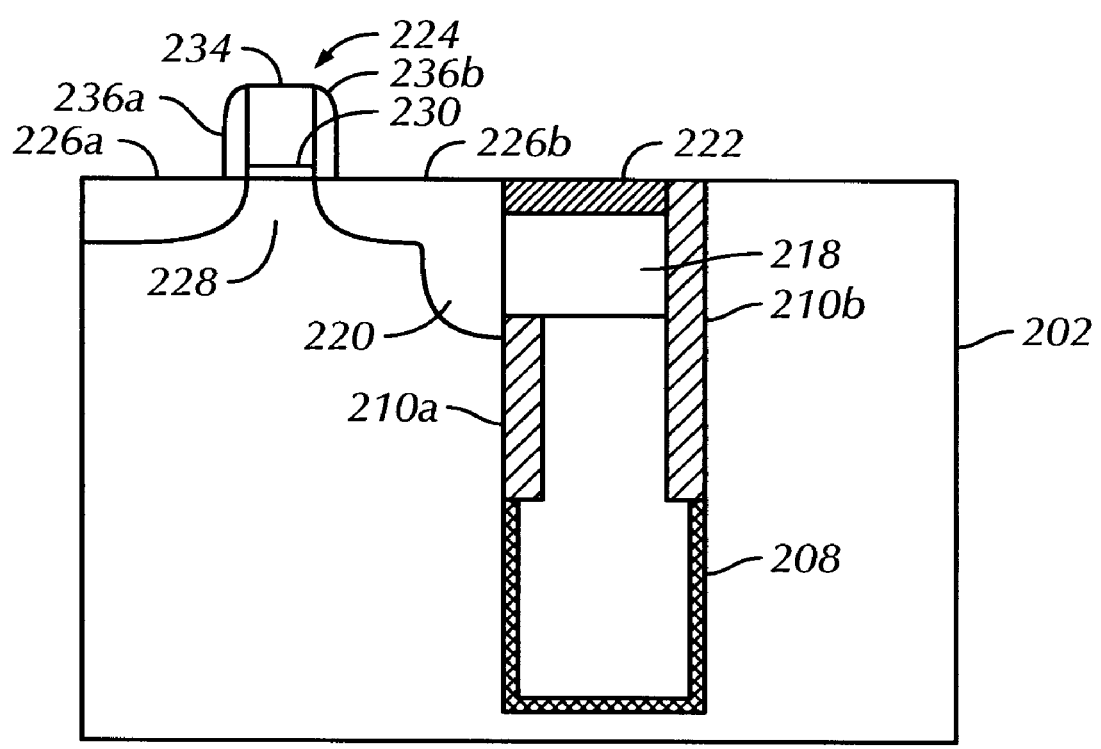

With reference to FIG. 10, in conjunction with FIGS. 6-9, the formation of a DRAM memory device is completed by forming isolation layer 222 (e.g. oxide formed in shallow trench isolation process; removing pad layer 204 and forming a transistor 224 by using processes well known in the art. Transistor 224 includes two source/drain terminals 226a and 226b separated by a channel region 228, a gate dielectric layer 234 above channel region 228, and a gate conductor 234 atop a gate dielectric 230. Source/drain terminal 226b is electrically connected to strap 220. Transistor 224 may further include spacers 236a, 236b on the sidewalls of gate conductor 234 and gate dielectric 230.

Figure 11:
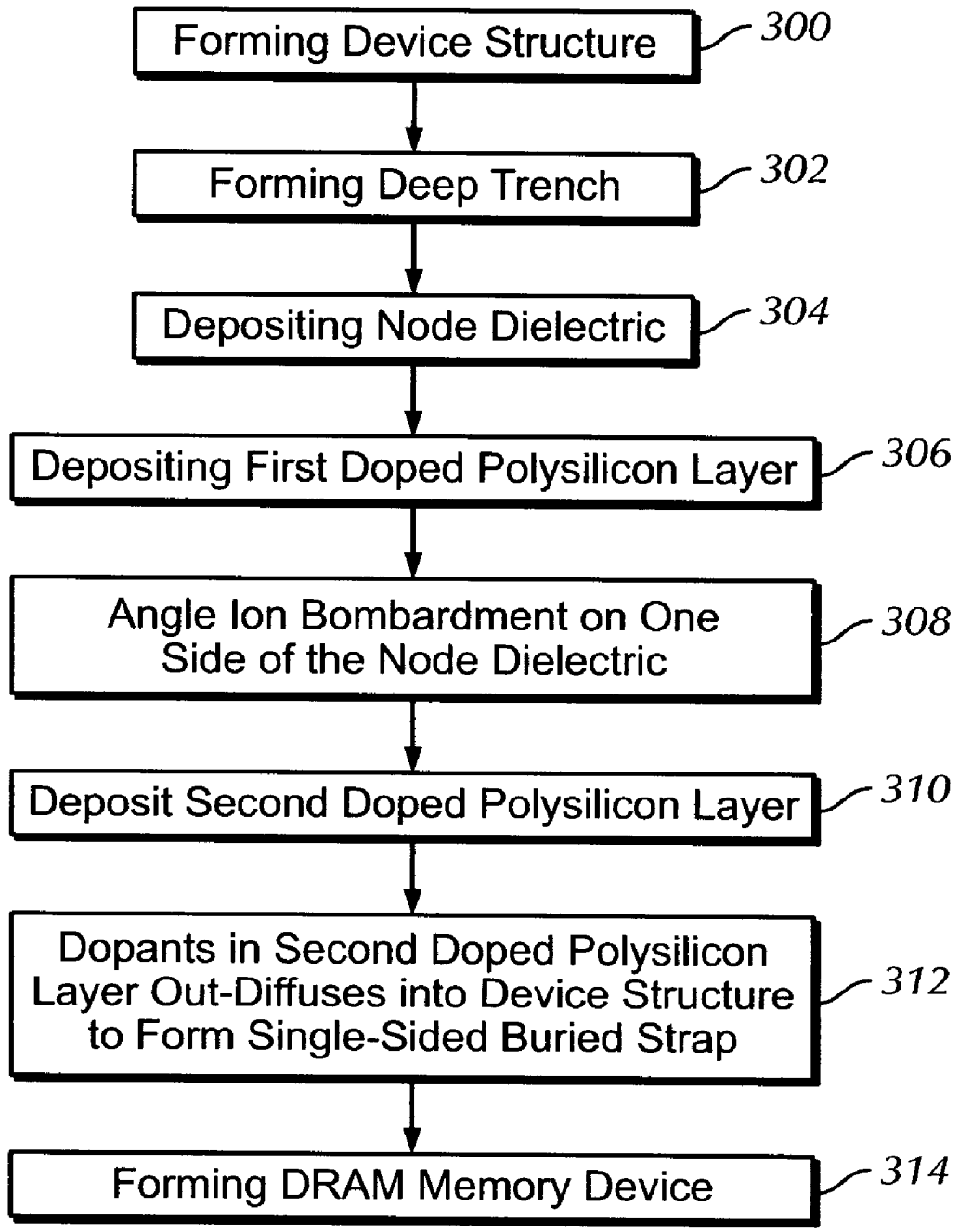
FIG. 11 is an exemplary flow diagram illustrating a method of forming a transistor trench memory cell structure having an asymmetric strap, in accordance with the present disclosure.

With reference to FIG. 11, in conjunction with FIGS. 2-10, a flow diagram of an exemplary method of forming a trench device structure having a single-side buried strap, in accordance with one embodiment of the present disclosure, is illustrated. Initially, at step 300, a device structure, such as, for example an SOI wafer 100 is formed having a silicon base layer 102, a BOX layer 104 and a SOI layer 106, as discussed hereinabove. In accordance with the present disclosure, at step 302, a trench location pattern is formed using a typical photolithographic process. Deep trench 110 is etched into the structure 100. At step 304, a node dielectric 111 is deposited. At step 306, a first conductive layer 112 is deposited over the node dielectric 111. At step 308, dopant ions are implanted at an angle into a portion of node dielectric 111, thereby removing a portion of the node dielectric from one side of deep trench 110. At step 310, a second conductive layer 116 (e.g. polysilicon) is deposited over polysilicon layer 112. Dopants in the second doped polysilicon layer 116 outdiffuses into a portion of SOI layer 106 to form a single-sided buried strap nitride 118 during a subsequent thermal anneal process (step 312). Finally, at step 314, the formation of a DRAM memory device is completed.

It will be understood that numerous modifications and changes in form and detail may be made to the embodiments of the presently disclosed structure and method of forming trench embedded DRAM with asymmetric strap. It is contemplated that numerous other configuration of the DRAM may be used, and the material of the structure and method may be selected from numerous materials other than those specifically disclosed. Therefore, the above description should not be construed as limiting the disclosed structure and method, but merely as exemplification of the various embodiments thereof. Those skilled in the art will envisioned numerous modifications within the scope of the present disclosure as defined by the claims appended hereto. Having thus complied with the details and particularity required by the patent laws, what is claimed and desired protected is set forth in the appended claims.

What is claimed is:

1. A method of forming a trench device structure having a single-side strap, the method comprising:
    forming a deep trench in a semiconductor substrate, said deep trench having a first side portion and a second side portion;
    depositing a node dielectric on said deep trench, wherein said node dielectric covers said first side portion and said second side portion;
    depositing a first conductive layer over said node dielectric;
    performing at least one of an ion implantation and ion bombardment at an angle into a portion of said node dielectric, thereby removing said portion of said node dielectric from said first side portion of said deep trench; and
    depositing a second conductive layer comprising dopants over said first conductive layer, wherein said dopants in said second conductive layer outdiffuses into a portion of said semiconductor substrate.

2. The method of forming a trench device structure as recited in claim 1, wherein said semiconductor substrate is a bulk Si substrate.

3. The method of forming a trench device structure as recited in claim 1, wherein said semiconductor substrate is an SOI substrate.

4. The method of forming a trench device structure as recited in claim 1, wherein said node dielectric is selected from a group consisting of oxide, nitride, oxynitride, and high-k dielectric.

5. The method of forming a trench device structure as recited in claim 1, wherein said first and second conductive layers are selected from a group consisting of polycrystalline silicon, amorphous silicon, germanium, silicon germanium, metals, conducting metallic compound materials, carbon nanotube, and conductive carbon.

6. The method of forming a trench device structure as recited in claim 1, wherein ions in said ion implantation or ion bombardment comprises ions selected from a group consisting of argon, xenon, krypton, germanium, silicon, arsenic, phosphorus, antimony, boron, and indium.

7. The method of forming a trench device structure as recited in claim 1, further comprising forming a transistor adjacent said single-sided strap, wherein at least a portion of said node dielectric prevents dopant diffusion on said second side portion of said trench.

8. The method of forming a trench device structure as recited in claim 1, further comprising:
    a collar insulating layer formed in an upper portion of said deep trench for isolating a portion of said first conductive layer from said semiconductor substrate, wherein said performing at least one of an ion implantation and ion bombardment removes a portion of said collar insulating layer from said first side portion of said deep trench to allow dopant outdiffusion from said first conductive layer to form a single sided strap.

9. The method of forming a trench device structure as recited in claim 8, wherein said dopants in said second conductive layer do not outdiffuse into a portion of said semiconductor substrate.

10. The method of forming a trench device structure as recited in claim 8, wherein said collar insulating layer composed of at least one material selected from a group consisting of thermal oxide, tetra ethyl ortho silicate, nitride, and high-k dielectric materials.

11. The method of forming a trench device structure as recited in claim 8, wherein said semiconductor substrate is a bulk Si substrate.

12. The method of forming a trench device structure as recited in claim 8, wherein said dopants are selected from a group consisting of arsenic, phosphorus, antimony, boron, and indium.

13. The method of forming a trench device structure as recited in claim 8, wherein said first and second conductive layers are composed of doped polysilicon.

14. The method of forming a trench device structure as recited in claim 8, wherein ions in said ion implantation or ion bombardment comprises ions selected from a group consisting of argon, xenon, krypton, germanium, silicon, arsenic, phosphorus, antimony, boron, and indium.

15. The method of forming a trench device structure as recited in claim 8, further comprising forming a transistor adjacent said single-sided strap, wherein at least a portion of said collar insulating layer prevents dopant diffusion on said second side portion of said deep trench.

16. The method of forming a trench device structure as recited in claim 8, wherein said collar insulating layer composed of at least one material selected from a group consisting of thermal oxide, tetra ethyl ortho silicate, nitride, and high-k dielectric materials.

17. A method of forming a design structure embodied in a computer readable medium for performing a means for fabricating a deep trench having a single-sided strap, the method comprising:

means for forming a deep trench in a semiconductor substrate, said deep trench having a first side portion and a second side portion;

means for depositing a node dielectric on said deep trench, wherein said node dielectric covers said first side portion and said second side portion;

means for depositing a first conductive layer over said node dielectric;

means for performing at least one of an ion implantation and an ion bombardment at an angle into a portion of said node dielectric, thereby removing said portion of said node dielectric from said first side portion of said deep trench; and means for depositing a second conductive layer over said first conductive layer, wherein said second conductive layer outdiffuses into a portion of said semiconductor substrate.

* * * * *